United States Patent
Lehtola et al.

(10) Patent No.: US 12,231,092 B2
(45) Date of Patent: Feb. 18, 2025

(54) METHODS RELATED TO POWER AMPLIFICATION SYSTEMS WITH ADJUSTABLE COMMON BASE BIAS

(71) Applicant: SKYWORKS SOLUTIONS, INC., Irvine, CA (US)

(72) Inventors: Philip John Lehtola, Cedar Rapids, IA (US); Scott W. Coffin, Marion, IA (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

(21) Appl. No.: 18/609,940

(22) Filed: Mar. 19, 2024

(65) Prior Publication Data
US 2024/0275338 A1    Aug. 15, 2024

Related U.S. Application Data

(63) Continuation of application No. 18/090,441, filed on Dec. 28, 2022, now Pat. No. 11,942,902, which is a
(Continued)

(51) Int. Cl.
*H03F 1/30* (2006.01)
*H03F 1/02* (2006.01)
(Continued)

(52) U.S. Cl.
CPC ............. *H03F 1/30* (2013.01); *H03F 1/0261* (2013.01); *H03F 1/22* (2013.01); *H03F 1/302* (2013.01);
(Continued)

(58) Field of Classification Search
CPC . H03F 1/30; H03F 1/0261; H03F 1/22; H03F 1/302; H03F 3/191; H03F 3/195;
(Continued)

(56) References Cited

U.S. PATENT DOCUMENTS

| 5,066,926 A | 11/1991 | Ramachandran et al. |
| 5,923,217 A | 7/1999 | Durec |

(Continued)

FOREIGN PATENT DOCUMENTS

| CN | 101939908 | 1/2011 |
| CN | 102474224 | 5/2012 |

(Continued)

OTHER PUBLICATIONS

Terry Millward, Biasing LDMOS FET devices in RF power amplifiers, Maxim Integrated Products, USA, Nov. 2005.

*Primary Examiner* — Andrea Lindgren Baltzell
*Assistant Examiner* — Khiem D Nguyen
(74) *Attorney, Agent, or Firm* — Chang & Hale LLP

(57) ABSTRACT

Methods related to power amplification systems with adjustable common base bias. A method of implementing a power amplification system can include providing a cascode amplifier coupled to a radio-frequency input signal and coupled to a radio-frequency output. The method can further include providing a biasing component configured to apply one or more biasing signals to the cascode amplifier, the biasing component including a bias controller and one or more bias components. Each respective bias component may be coupled to a respective bias transistor.

20 Claims, 8 Drawing Sheets

Related U.S. Application Data continuation of application No. 16/372,410, filed on Apr. 2, 2019, now Pat. No. 11,545,938, which is a continuation of application No. 15/641,306, filed on Jul. 4, 2017, now Pat. No. 10,250,202, which is a continuation of application No. 14/867,227, filed on Sep. 28, 2015, now Pat. No. 9,698,734.

(60) Provisional application No. 62/116,499, filed on Feb. 15, 2015.

(51) Int. Cl.

| | | |
|---|---|---|
| *H03F 1/22* | (2006.01) | |
| *H03F 3/191* | (2006.01) | |
| *H03F 3/195* | (2006.01) | |
| *H03F 3/21* | (2006.01) | |
| *H03F 3/24* | (2006.01) | |
| *H04B 1/04* | (2006.01) | |

(52) U.S. Cl.
CPC .......... *H03F 3/191* (2013.01); *H03F 3/195* (2013.01); *H03F 3/211* (2013.01); *H03F 3/24* (2013.01); *H03F 3/245* (2013.01); *H03F 2200/447* (2013.01); *H03F 2200/451* (2013.01); *H03F 2200/468* (2013.01); *H03F 2203/21106* (2013.01); *H04B 2001/0408* (2013.01)

(58) Field of Classification Search
CPC . H03F 3/211; H03F 3/24; H03F 3/245; H03F 2200/447; H03F 2200/451; H03F 2200/468; H03F 2203/21106; H03F 1/0211; H03F 1/301; H03F 3/189; H03F 3/68; H04B 2001/0408
USPC .................................. 330/295, 296, 285, 311
See application file for complete search history.

(56) References Cited

U.S. PATENT DOCUMENTS

| | | |
|---|---|---|
| 7,911,280 B2 | 3/2011 | Koerner |
| 7,936,213 B2 | 5/2011 | Shin et al. |
| 10,250,202 B2 | 4/2019 | Lehtola et al. |
| 2005/0218989 A1 | 10/2005 | Tsutsui et al. |
| 2009/0195317 A1 | 8/2009 | Zhang et al. |
| 2010/0226411 A1 | 9/2010 | Watanabe et al. |
| 2011/0043284 A1 | 2/2011 | Zhao et al. |
| 2011/0316633 A1 | 12/2011 | Tadano |
| 2012/0139635 A1 | 6/2012 | Ho et al. |
| 2012/0161877 A1 | 6/2012 | Southcombe et al. |
| 2013/0082777 A1 | 4/2013 | Yoo et al. |
| 2014/0028402 A1 | 1/2014 | An et al. |
| 2014/0184334 A1 | 7/2014 | Nobbe et al. |
| 2015/0048887 A1 | 2/2015 | Nitta et al. |
| 2015/0054583 A1* | 2/2015 | Miyashita ............. H03F 1/3205 330/285 |

FOREIGN PATENT DOCUMENTS

| | | |
|---|---|---|
| JP | S59228475 | 12/1984 |
| JP | S60167505 | 8/1985 |
| JP | H05308233 | 11/1993 |
| JP | 2006303850 | 11/2006 |
| JP | 2011040815 | 2/2011 |
| JP | 2012015602 | 1/2012 |
| JP | 5321335 | 10/2013 |
| JP | 2014027661 | 2/2014 |
| JP | 2014090299 | 5/2014 |
| KR | 1020080098881 | 11/2008 |
| KR | 1020130130606 | 12/2013 |
| WO | 2003/073627 | 9/2003 |
| WO | 2008/035480 | 3/2008 |
| WO | 2013/153894 | 10/2013 |
| WO | 2013/188712 | 12/2013 |

\* cited by examiner

METHODS RELATED TO POWER AMPLIFICATION SYSTEMS WITH ADJUSTABLE COMMON BASE BIAS

CROSS-REFERENCE TO RELATED APPLICATION(S)

This application is a continuation of U.S. patent application Ser. No. 18/090,441, filed Dec. 28, 2022, entitled "METHODS RELATED TO POWER AMPLIFICATION SYSTEM WITH ADJUSTABLE COMMON BASE BIAS," which is a continuation of U.S. patent application Ser. No. 16/372,410, filed Apr. 2, 2019, entitled "POWER AMPLIFICATION SYSTEM WITH ADJUSTABLE COMMON BASE BIAS," now U.S. Pat. No. 11,545,938, issued Jan. 3, 2023, which is a continuation of U.S. patent application Ser. No. 15/641,306, filed Jul. 4, 2017, entitled "POWER AMPLIFICATION SYSTEM WITH ADJUSTABLE COMMON BASE BIAS," now U.S. Pat. No. 10,250,202, issued Apr. 2, 2019, which is a continuation of U.S. patent application Ser. No. 14/867,227, filed Sep. 28, 2015, entitled "POWER AMPLIFICATION SYSTEM WITH ADJUSTABLE COMMON BASE BIAS," now U.S. Pat. No. 9,698,734, issued Jul. 4, 2017, which claims priority to U.S. Provisional Application No. 62/116,499, filed Feb. 15, 2015, entitled "ADJUSTABLE CASCODE BIAS," the disclosure of each of which is hereby expressly incorporated by reference herein in its entirety.

BACKGROUND

Field

The present disclosure generally relates to power amplifiers.

Description of the Related Art

A power amplification system can include a cascode power amplifier having a common base stage and a common emitter stage. The signals used to bias the stages can be fixed voltages, selected to prevent saturation of the stages in worst case conditions. However, this may result in excessive margin under low power conditions, reducing the efficiency of the power amplification system.

SUMMARY

In accordance with some implementations, the present disclosure relates to a power amplification system. The power amplification system includes a first transistor having a base coupled to a radio-frequency input and a second transistor having an emitter coupled to a collector of the first transistor and having a collector coupled to a radio-frequency output. The power amplification system further includes a biasing component configured to apply a fixed biasing signal to the base of the first transistor and to apply an adjustable biasing signal to the base of the second transistor.

In some embodiments, the biasing component can be configured to apply the adjustable biasing signal based on a temperature of the power amplification system. In some embodiments, the biasing component can be configured to apply a higher adjustable biasing signal in response to a lower temperature and a lower adjustable biasing signal in response to a higher temperature. In some embodiments, the power amplification system can further include a temperature sensor configured to determine the temperature. In some embodiments, the biasing component can be configured to receive a temperature signal indicative of the temperature.

In some embodiments, the biasing component can be configured to apply the adjustable biasing signal based on power condition of the power amplification system. In some embodiments, the biasing component can be configured to apply a higher adjustable biasing signal in response to a higher output power and a lower adjustable biasing signal in response to a lower output power. In some embodiments, the power amplification system can include a power sensor configured to determine the output power. In some embodiments, the power sensor can be coupled to a supply voltage and can be configured to determine the output power based on the supply voltage. In some embodiments, the collector of the second transistor can be coupled to the supply voltage via an inductor. In some embodiments, the power sensor can be coupled to the radio-frequency output and can be configured to determine the output power based on the radio-frequency output. In some embodiments, the biasing component can be configured to receive a power signal indicative of the power condition.

In some embodiments, the biasing component can be configured to apply the adjustable biasing signal based on a modulation standard of the radio-frequency input.

In some embodiments, the adjustable biasing signal can be an adjustable biasing voltage.

In some embodiments, the biasing component can include an analog circuit that provides the adjustable biasing signal. In some embodiments, the biasing component can include a digital circuit that stores a table of biasing voltage values in respective association with a plurality of temperature values and/or power conditions.

In some embodiments, the biasing component includes a third transistor having a collector coupled to a battery voltage, an emitter coupled to the base of the second transistor, and a base coupled to buffer amplifier.

In some implementations, the present disclosure relates to a radio-frequency (RF) module including a packaging substrate configured to receive a plurality of components. The RF module further includes a power amplification system implemented on the packaging substrate. The power amplification system includes a first transistor having a base coupled to a radio-frequency input and a second transistor having an emitter coupled to a collector of the first transistor and having a collector coupled to a radio-frequency output. The power amplification system includes a biasing component configured to apply a fixed biasing signal to the base of the first transistor and to apply an adjustable biasing signal to the base of the second transistor.

In some embodiments, the RF module can be a front-end module (FEM).

In some implementations, the present disclosure relates to a wireless device including a transceiver configured to generate a radio-frequency (RF) signal. The wireless device includes a front-end module (FEM) in communication with the transceiver. The FEM includes a packaging substrate configured to receive a plurality of components. The FEM further including a power amplification system implemented on the packaging substrate. The power amplification system includes a first transistor having a base coupled to a radio-frequency input to receive the radio-frequency signal and a second transistor having an emitter coupled to a collector of the first transistor and having a collector coupled to a radio-frequency output. The power amplification system includes a biasing component configured to apply a fixed biasing signal to the base of the first transistor and to apply an adjustable biasing signal to the base of the second transistor. The wireless device includes an antenna in communication with the FEM. The antenna is antenna configured to transmit an amplified version of the radio-frequency signal received from the radio-frequency output.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

DETAILED DESCRIPTION OF SOME EMBODIMENTS

The headings provided herein, if any, are for convenience only and do not necessarily affect the scope or meaning of the claimed invention.

Figure 1:
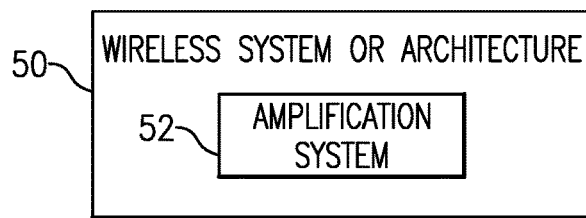
FIG. 1 shows an example wireless system or architecture.

Referring to FIG. 1, one or more features of the present disclosure generally relate to a wireless system or architecture 50 having an amplification system 52. In some embodiments, the amplification system 52 can be implemented as one or more devices, and such device(s) can be utilized in the wireless system/architecture 50. In some embodiments, the wireless system/architecture 50 can be implemented in, for example, a portable wireless device. Examples of such a wireless device are described herein.

Figure 2:
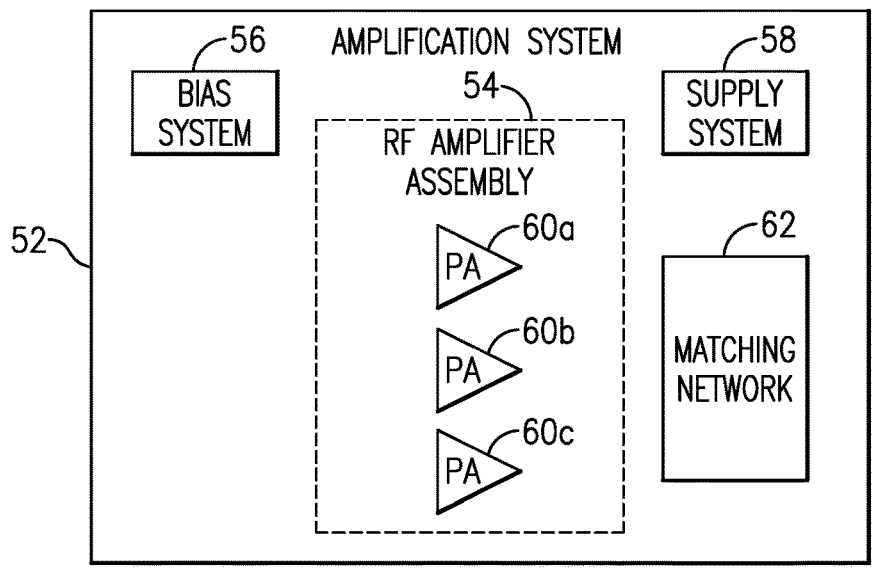
FIG. 2 shows that, in some implementations, an amplification system can include a radio-frequency (RF) amplifier assembly having one or more power amplifiers.

FIG. 2 shows that the amplification system 52 of FIG. 1 typically includes a radio-frequency (RF) amplifier assembly 54 having one or more power amplifiers (PAs). In the example of FIG. 2, three PAs 60a-60c are depicted as forming the RF amplifier assembly 54. It will be understood that other numbers of PA(s) can also be implemented. It will also be understood that one or more features of the present disclosure can also be implemented in RF amplifier assemblies having other types of RF amplifiers.

In some embodiments, the RF amplifier assembly 54 can be implemented on one or more semiconductor die, and such die can be included in a packaged module such as a power amplifier module (PAM) or a front-end module (FEM). Such a packaged module is typically mounted on a circuit board associated with, for example, a portable wireless device.

The PAs (e.g., 60a-60c) in the amplification system 52 are typically biased by a bias system 56. Further, supply voltages for the PAs are typically provided by a supply system 58. In some embodiments, either or both of the bias system 56 and the supply system 58 can be included in the foregoing packaged module having the RF amplifier assembly 54.

In some embodiments, the amplification system 52 can include a matching network 62. Such a matching network can be configured to provide input matching and/or output matching functionalities for the RF amplifier assembly 54.

Figure 3A:
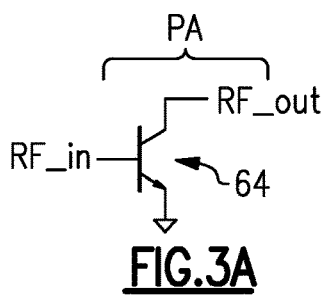
FIG. 3A shows a first example configuration of a power amplifier.

For the purpose of description, it will be understood that each PA (60) of FIG. 2 can be implemented in a number of ways. FIGS. 3A-3E show non-limiting examples of how such a PA can be configured. FIG. 3A shows an example PA having an amplifying transistor 64, where an input RF signal (RF_in) is provided to a base of the transistor 64, and an amplified RF signal (RF_out) is output through a collector of the transistor 64.

Figure 3B:
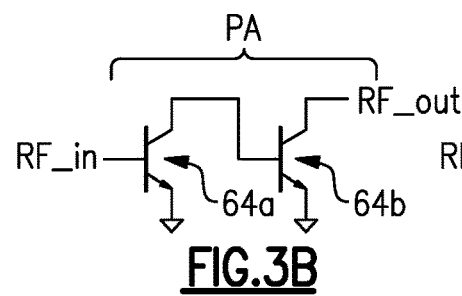
FIG. 3B shows a second example configuration of a power amplifier.

FIG. 3B shows an example PA having a plurality of amplifying transistors (e.g., 64a, 64b) arranged in stages. An input RF signal (RF_in) is provided to a base of the first transistor 64a, and an amplified RF signal from the first transistor 64a is output through its collector. The amplified RF signal from the first transistor 64a is provided to a base of the second transistor 64b, and an amplified RF signal from the second transistor 64b is output through its collector to thereby yield an output RF signal (RF_out) of the PA.

Figure 3C:
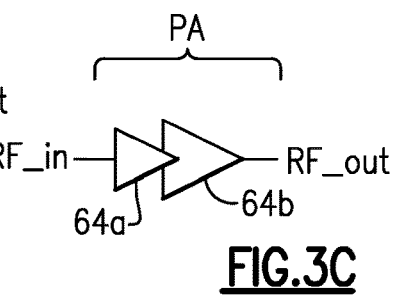
FIG. 3C shows a third example configuration of a power amplifier.

In some embodiments, the foregoing example PA configuration of FIG. 3B can be depicted as two or more stages as shown in FIG. 3C. The first stage 64a can be configured as, for example, a driver stage; and the second stage 64b can be configured as, for example, an output stage.

Figure 3D:
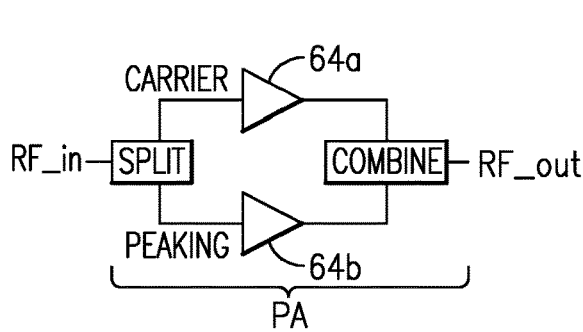
FIG. 3D shows a fourth example configuration of a power amplifier.

FIG. 3D shows that in some embodiments, a PA can be configured as a Doherty PA. Such a Doherty PA can include amplifying transistors 64a, 64b configured to provide carrier amplification and peaking amplification of an input RF signal (RF_in) to yield an amplified output RF signal (RF_out). The input RF signal can be split into the carrier portion and the peaking portion by a splitter. The amplified carrier and peaking signals can be combined to yield the output RF signal by a combiner.

Figure 3E:
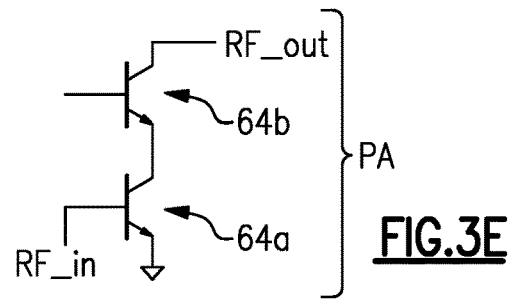
FIG. 3E shows a fifth example configuration of a power amplifier.

FIG. 3E shows that in some embodiments, a PA can be implemented in a cascode configuration. An input RF signal (RF_in) can be provided to a base of the first amplifying transistor 64a operated as a common emitter device. The output of the first amplifying transistor 64a can be provided through its collector and be provided to an emitter of the second amplifying transistor 64b operated as a common base device. The output of the second amplifying transistor 64b can be provided through its collector so as to yield an amplified output RF signal (RF_out) of the PA.

In the various examples of FIGS. 3A-3E, the amplifying transistors are described as bipolar junction transistors (BJTs) such as heterojunction bipolar transistors (HBTs). It will be understood that one or more features of the present disclosure can also be implemented in or with other types of transistors such as field-effect transistors (FETs).

Figure 4:
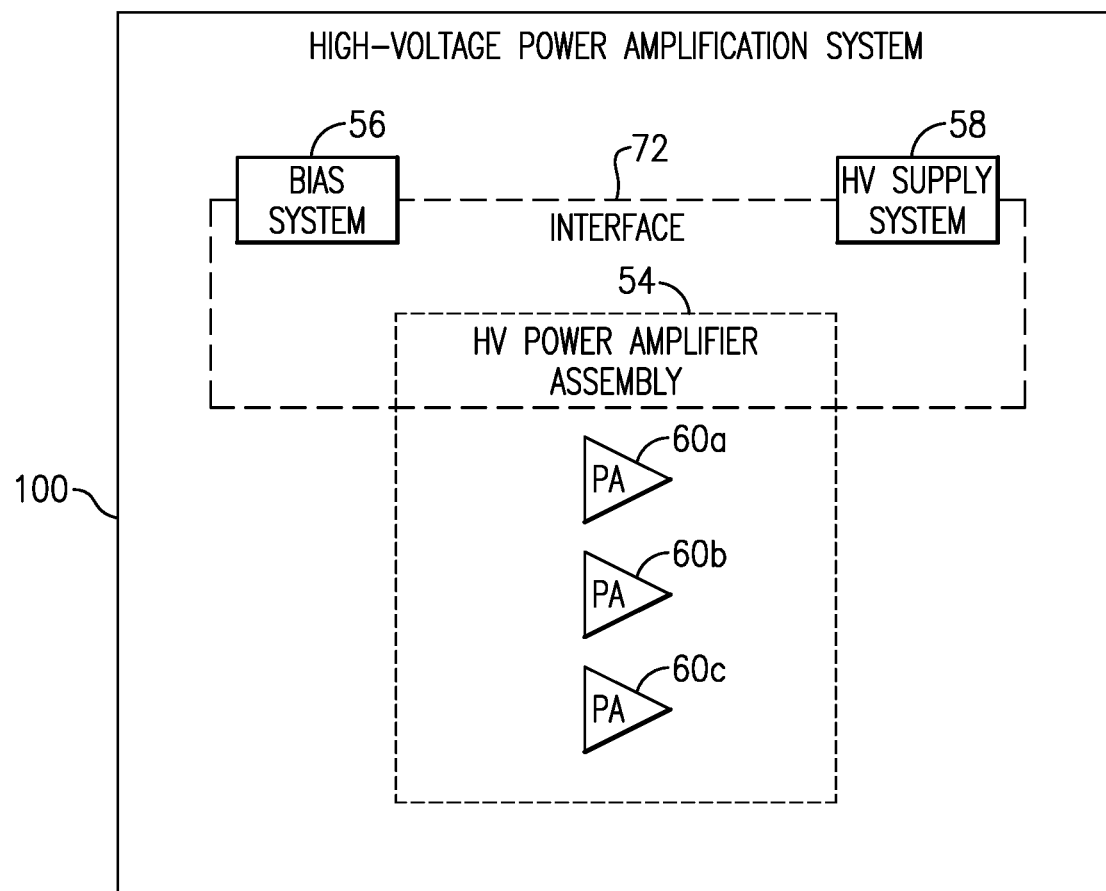
FIG. 4 shows that, in some implementations, an amplification system can be implemented as a high-voltage (HV) power amplification system.

FIG. 4 shows that in some embodiments, the amplification system 52 of FIG. 2 can be implemented as a high-voltage (HV) power amplification system 70. Such a system can include an HV power amplifier assembly 54 configured to include HV amplification operation of some or all of the PAs (e.g., 60a-60c). As described herein, such PAs can be biased by a bias system 56. In some embodiments, the foregoing HV amplification operation can be facilitated by an HV supply system 58. In some embodiments, an interface system 72 can be implemented to provide interface functionalities between the HV power amplifier assembly 54 and either or both of the bias system 56 and the HV supply system 58.

Figure 5:
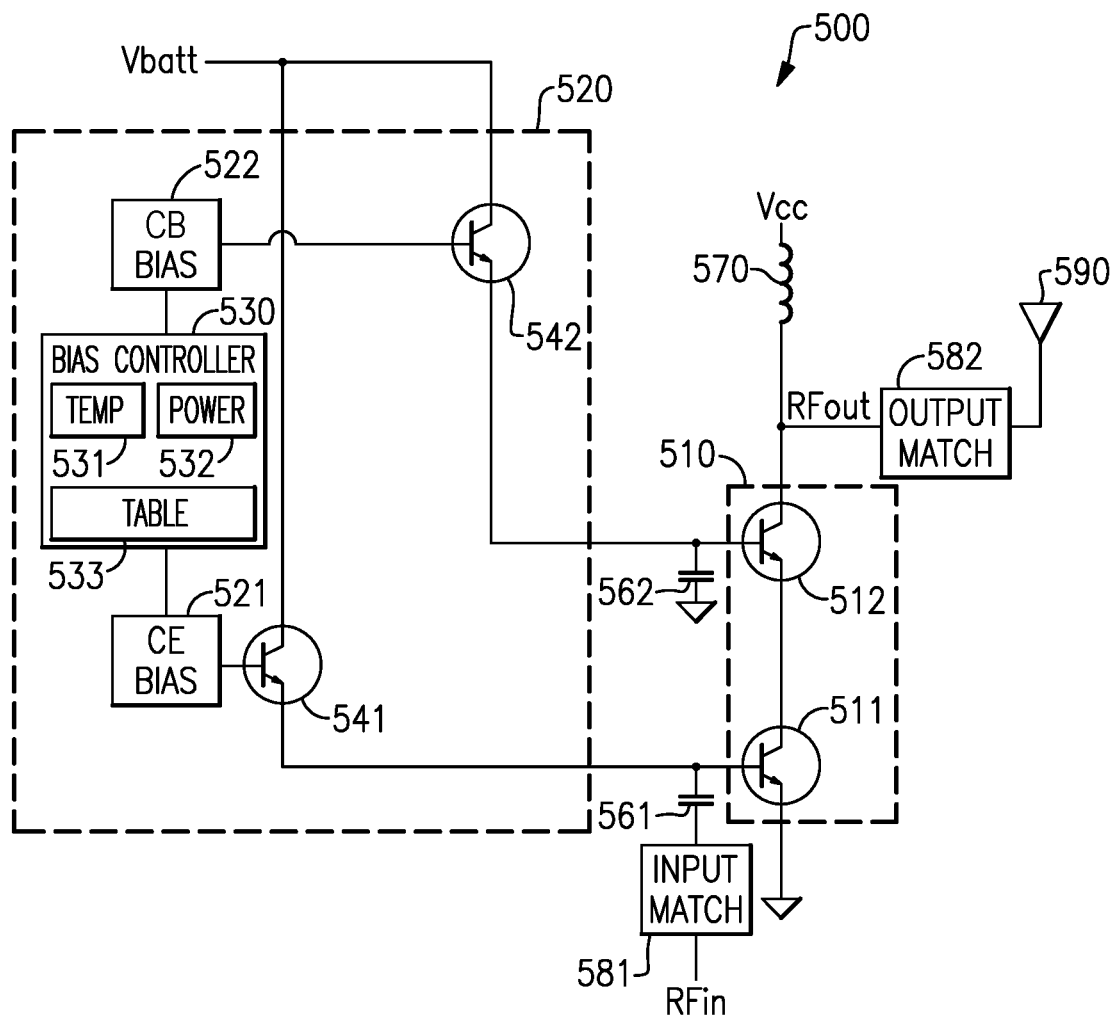
FIG. 5 shows that in some embodiments, a power amplification system can be implemented as a cascode amplifier with an adjustable bias signal.

FIG. 5 shows that in some embodiments, a power amplification system 500 can be implemented as a cascode amplifier 510 with an adjustable bias signal. The cascode amplifier 510 includes a first transistor 511 of a common emitter (CE) stage (also referred to as an RF stage). The emitter of the first transistor 511 is coupled to a ground voltage. The base of the first transistor 511 is coupled, via a capacitor 561 and an input matching component 581 to an RF input. The base of the first transistor 511 is also coupled to a biasing component 520 that biases the common emitter stage.

The biasing component 520 provides a CE biasing signal, e.g., a bias voltage or a bias current, that biases the first transistor 511. The CE biasing signal may be powered by voltage from a battery (Vbatt) that is at least partially fed to the base of the first transistor 511 when a CE bias component 521 (as controlled by a bias controller 530) biases a CE bias transistor 541. The CE biasing signal may have a fixed value (e.g., a voltage or a current with a fixed value). The collector of the first transistor 511 is coupled to the emitter of a second transistor 512 of a common base stage.

The cascode amplifier 510 includes a second transistor 512 of a common base (CB) stage (also referred to as a cascode stage). The emitter of the second transistor 512 is coupled to the collector of the first transistor 511. The collector of the second transistor 512 is coupled, via an inductor 570, to a supply voltage (Vcc). An RF output (an amplified version of the RF input) is output from the collector of the second transistor 512. The RF output passes through an output matching component 582 (which may also perform bandpass filtering) and can be transmitted via an antenna 590. The base of the second transistor 512 is coupled, via a capacitor 562, to the ground voltage. The base of the second transistor 512 is also coupled to the biasing component 520 that biases the common base stage. The biasing component 520 provides a CB biasing signal, e.g., a bias voltage or a bias current, that biases the second transistor 512. The CB biasing signal may be powered by voltage from the battery (Vbatt) that is at least partially fed to the base of the second transistor 512 when a CB bias component 522 (as controlled by the bias controller 530) biases a CB bias transistor 542. The strength of the CB biasing signal provided by the CB bias component 522 may be variable (or adjustable) depending on a number of factors as described further below.

The common base stage of a cascode power amplifier in a bipolar process may introduce an increase in the effective minimum Vce or knee voltage of the amplifying device. The minimum Vce may reduce the signal swing for the amplifier which may ultimately reduce the amplifier efficiency. As the saturation point of the amplifier may be a function of the BE (base-emitter) and BC (base-collector) junctions within the second transistor 512, as well as parasitic resistance terms, the minimum Vce may also demonstrate a sensitivity to temperature and device current. The impact of this minimum Vce may be more significant at lower output powers as the system supply voltage (Vcc) is decreased towards the minimum Vce voltage.

Thus, as mentioned above, the biasing component 520 may adjust the CB biasing signal (e.g., a cascode bias voltage) to improve or optimize performance of the power amplification system 500. For example, the biasing component 520 may adjust the CB biasing signal such that overhead for temperature and high current is reduced at lower current and alternate temperature conditions.

In one embodiment, the CB bias signal is a fixed voltage, selected to support worst case conditions. However, this may result in excessive margin under nominal and low power conditions which reduces the efficiency of the power amplification system 500. Thus, in other embodiments, the CB bias signal provided by the biasing component 520 is a variable voltage.

In some implementations, the bias controller 530 generates a reference voltage and feeds the reference voltage to the CB bias component 522. Based on reference voltage, the CB bias component 522, using the battery voltage and the CB bias transistor 542, generates the CB bias signal and provides the CB bias signal to the base of the second transistor 512. In some implementations, the CB bias component 522 is a buffer amplifier.

The reference voltage generated by the bias controller 530 may be adjusted based upon temperature and output power such that the minimum Vce variation is compensated to improve performance.

For example, at high power, the BE junction voltage may be greater than at lower power, and the biasing component 520 may provide a CB bias signal with a higher voltage to prevent saturation of the common emitter stage. As another example, at lower output power, the BE junction voltage may be less than at higher power, and the biasing component 520 may provide a CB bias signal with a lower voltage. Similarly, with respect to temperature, the BE junction voltage and saturation voltage may increase with decreased temperature, and the biasing component 520 may provide a CB bias signal with a higher voltage in low temperature conditions relative to high temperature conditions.

To reduce collector current in a low power mode (LPM), the supply voltage (Vcc) may be reduced. However, the common base stage may saturate if the supply voltage is too low without also lowering the voltage of the CB bias signal. However, the common emitter stage of the cascode power amplifier may saturate if a CB bias signal with too low a voltage is applied. Thus, as described above, the biasing component 520 may adjust the voltage of the CB bias signal under various power and temperature conditions.

In one embodiment, the biasing component 520 includes a temperature sensor 531 that detects temperature. For example, the biasing component 520 may include a thermistor. In some implementations, as shown in FIG. 5, the bias controller 530 includes a temperature sensor 531. In some implementations, the bias controller 530 receives a temperature signal (e.g., via an input terminal) indicative of the temperature of the power amplification system 500.

In one embodiment, the biasing component 520 includes a power sensor 532 that detects a power condition of the power amplification system 500. The power condition can be a power mode of the power amplification system 500, e.g. a default mode or a lower power mode. The power condition can be an output power of the power amplification system 500. The power condition can be the supply voltage applied to the cascode amplifier 510. For example, the biasing component 520 may be coupled to RF output (e.g., via a coupler) or to the supply voltage (Vcc) to determine to determine the power mode, the output power, or the supply voltage. In some implementations, as shown in FIG. 5, the bias controller 530 includes a power sensor 532. In some implementations, the bias controller 530 receives a power signal (e.g., via an input terminal) indicative of the power condition of the power amplification system 500.

In some implementations, the biasing component 520 determines a voltage (or other characteristic) of the CB biasing signal using an analog circuit that outputs a particular bias voltage at certain temperatures and/or power conditions. In some implementations, the biasing component 520 determines a voltage (or other characteristic) of the CB biasing signal using a digital circuit that stores a table 533 of bias voltage values in respective association with a plurality of temperature values and/or power condition indicia.

Accordingly, FIG. 5 shows a power amplification system 500 including a first transistor 511 having a base coupled to a radio-frequency input and a second transistor 512 having an emitter coupled to a collector of the first transistor 511 and a collector coupled to a radio-frequency output. The power amplification system further includes a biasing component 520 configured to apply a fixed biasing signal (e.g., a bias signal with a fixed voltage) to the base of the first transistor 511 and to apply an adjustable biasing signal (e.g., a bias signal with an adjustable voltage) to the base of the second transistor 512.

As described above, the biasing component 520 can be configured to apply the adjustable biasing signal based on a temperature of the power amplification system 500. The biasing component 520 can apply a higher adjustable biasing signal (e.g., a bias signal with a higher voltage) in response to a lower temperature and a lower adjustable biasing signal (e.g. a bias signal with a lower voltage) in response to a higher temperature.

As also described above, the biasing component 520 can be configured to apply the adjustable biasing signal based on a power condition of the power amplification system. The biasing component 520 can apply a higher adjustable biasing signal in response to a higher output power and lower adjustable biasing signal in response to a lower output power.

Figure 6:
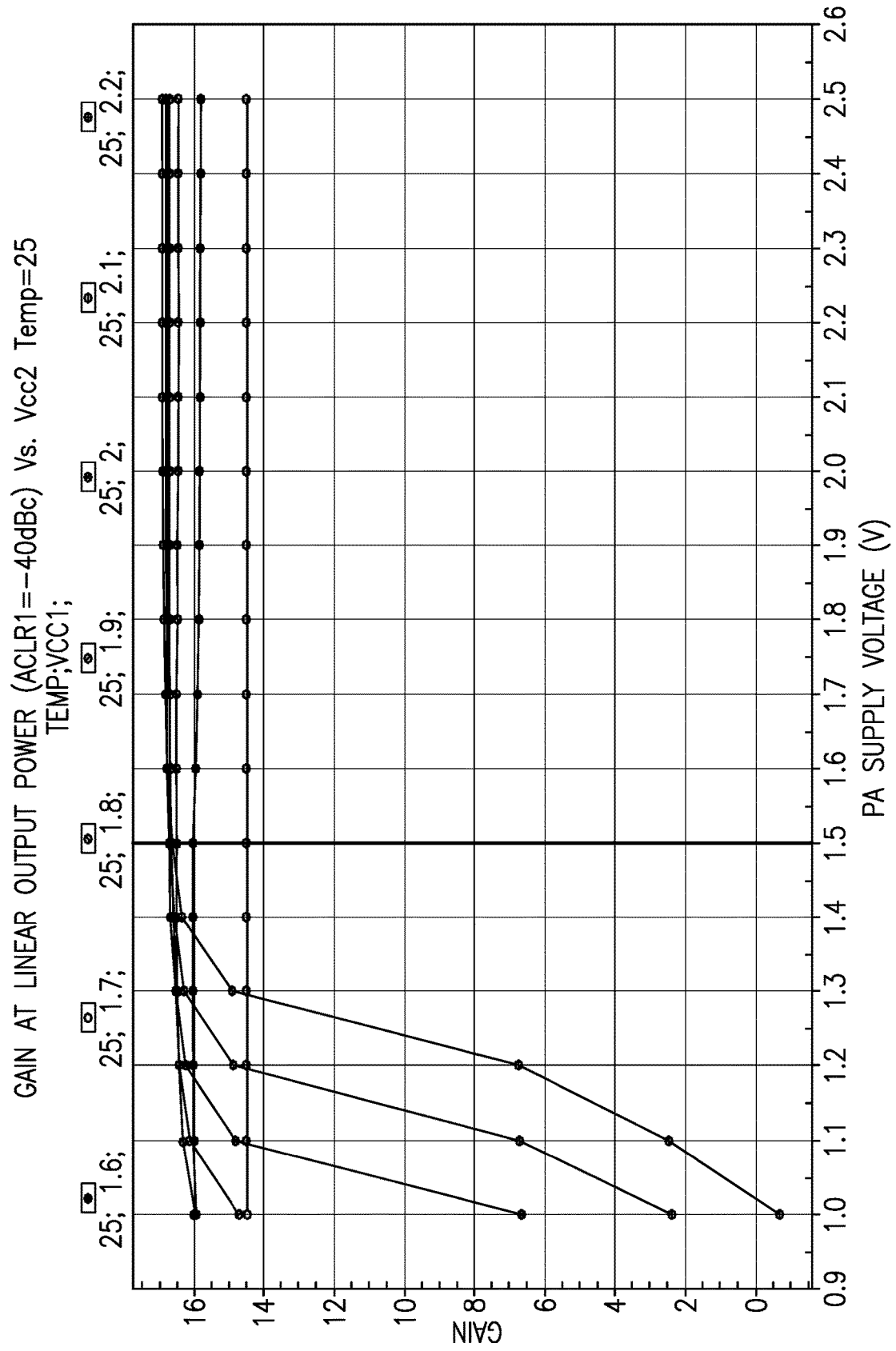
FIG. 6 shows example plots of the gain of a power amplification system as a function of supply voltage (Vcc) for various common base bias voltages.

FIG. 6 shows example plots of the gain of a power amplification system (e.g, the power amplification system 500 of FIG. 5) as a function of supply voltage (Vcc) for various common base bias voltages. The left half of FIG. 6 shows the result of the common base stage saturation point voltage decreasing with lower common base bias voltage. The right half of FIG. 6 (particularly the two lowest lines) shows the result of the common emitter stage saturating at low cascode bias voltages.

Figure 7:
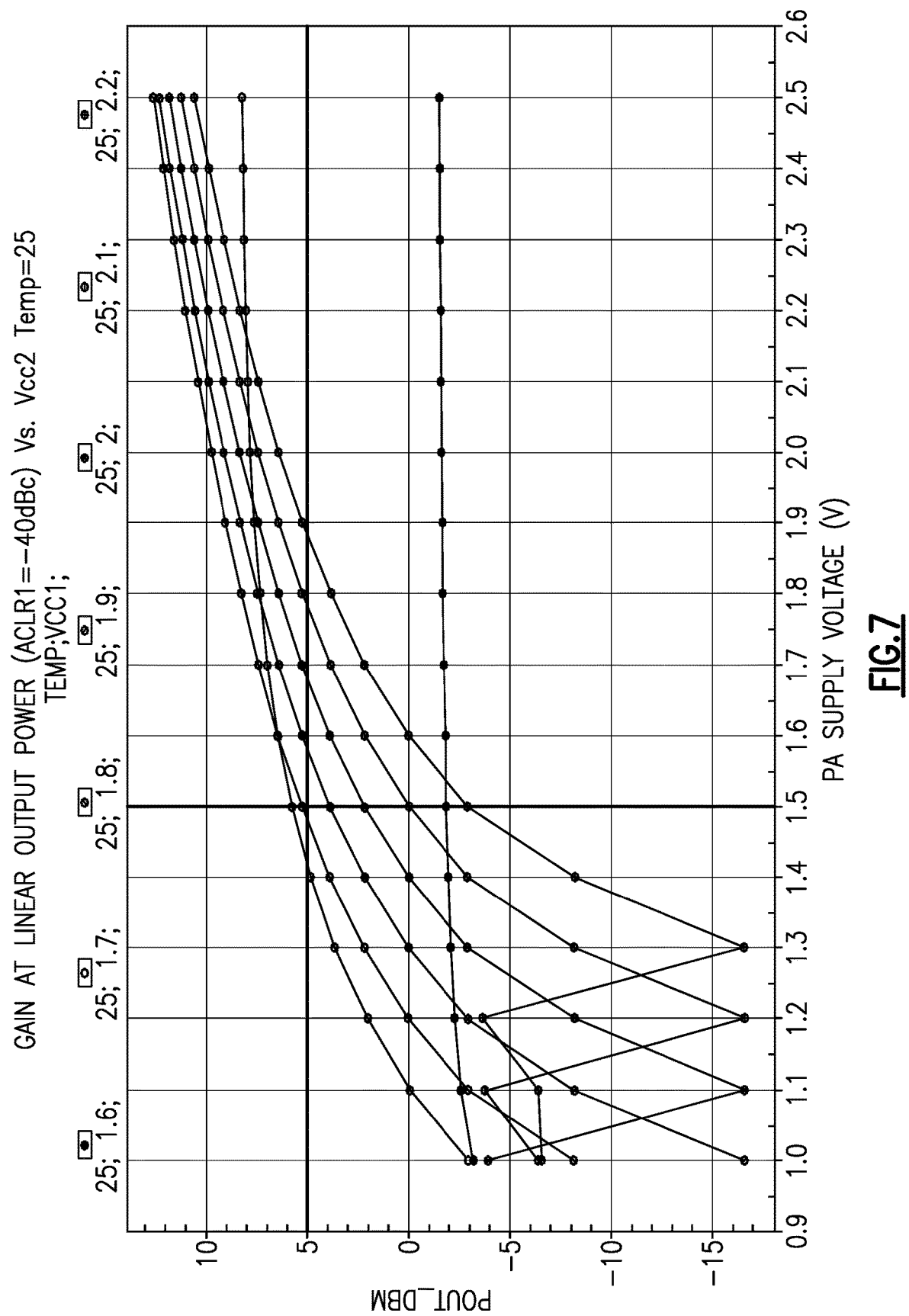
FIG. 7 shows example plots of the output power of a power amplification system as a function of supply voltage (Vcc) for various common base bias voltages.

FIG. 7 shows example plots of the output power of a power amplification system (e.g, the power amplification system 500 of FIG. 5) as a function of supply voltage (Vcc) for various common base bias voltages. The left half of FIG. 6 shows that a lower common base bias voltage supports increased linear power at lower supply voltage conditions. The right half of FIG. 7 (particularly the two lowest lines) shows that a saturated common emitter stage limits power independent of supply voltage.

Figure 8:
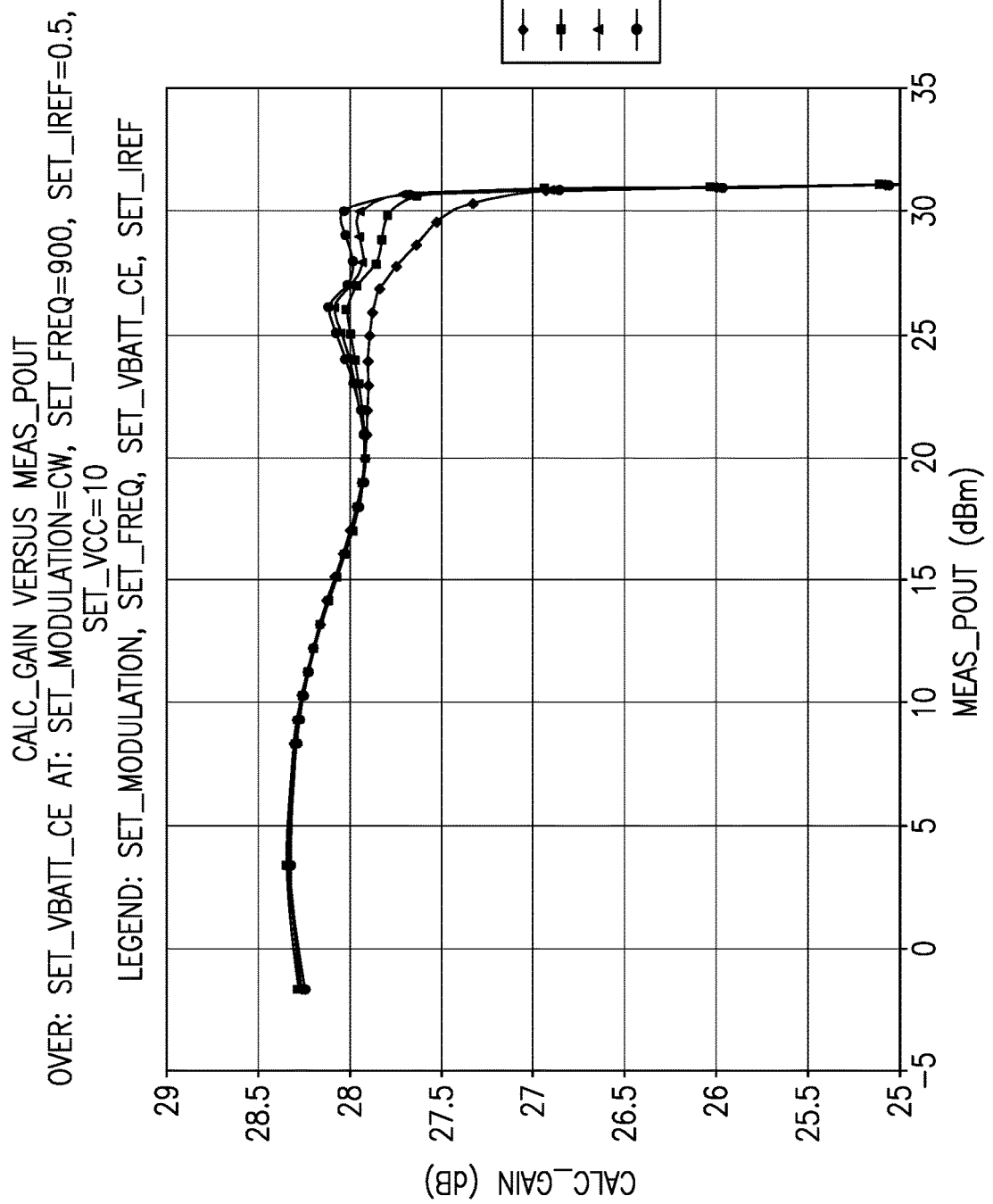
FIG. 8 shows an example plot of the AMAM (amplitude-modulation to amplitude-modulation) response of a power amplification system for various common base bias voltages.

FIG. 8 shows an example plot of the AMAM (amplitude-modulation to amplitude-modulation) response of a power amplification system (e.g. the power amplification system 500 of FIG. 5) for various common base bias voltages. The example plot shows the calculated gain plotted against the measured output power. As the compression characteristic of a cascode amplifier may be a combination of the common base stage compression (e.g., as a result of saturation) as well as the common base stage compression (e.g., as a result of saturation), the gain characteristic of the amplifier can be impacted through the common base bias voltage applied to the cascode amplifier. Different modulation standards may be optimized under different compression characteristics and the common base bias voltage can be adjusted to compensate and improve performance for a given modulation standard and switched between multiple modulation standards. Thus, in some implementations, the biasing component 520 of FIG. 5 is configuration to apply to the adjustable biasing signal (e.g., to the second transistor 512) based on a modulation standard of the radio-frequency input.

Figure 9:
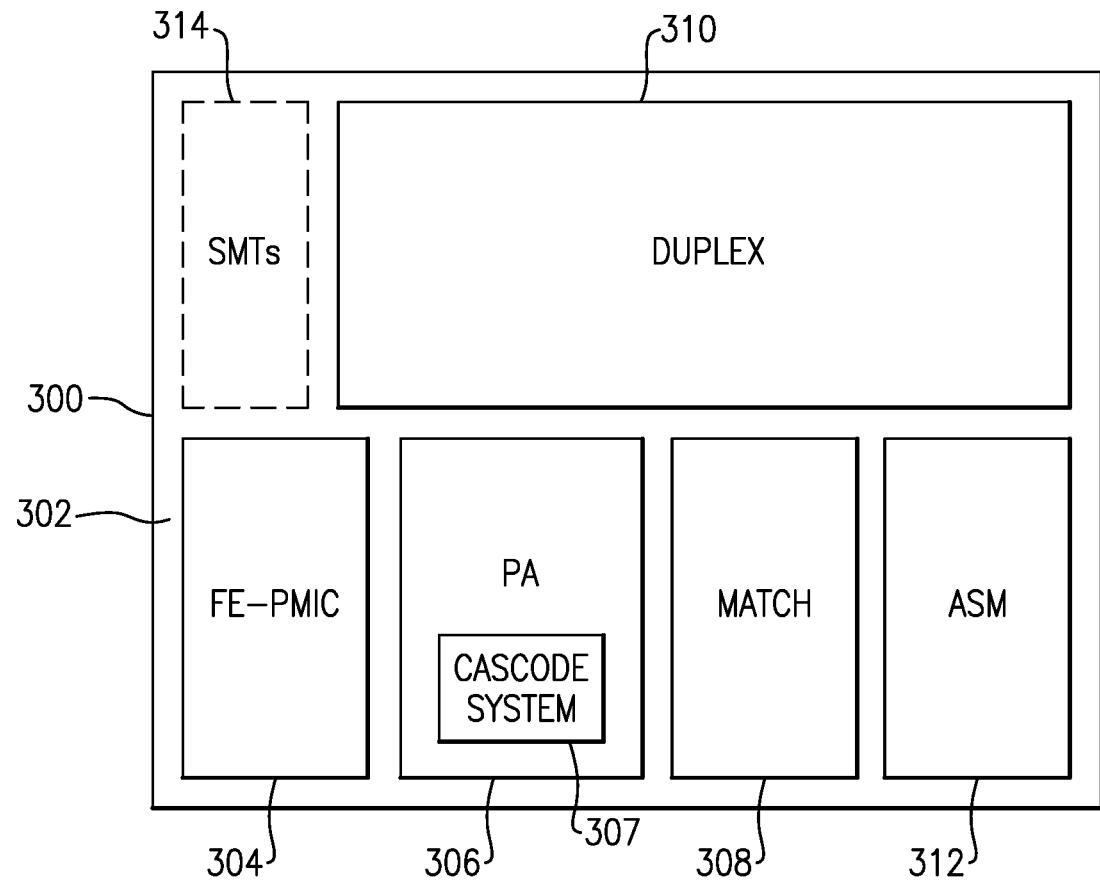
FIG. 9 depicts a module having one or more features as described herein.

FIG. 9 shows that in some embodiments, some or all of a power amplification system (e.g., the power amplification system 500 of FIG. 5) can be implemented in a module. Such a module can be, for example, a front-end module (FEM). In the example of FIG. 9, a module 300 can include a packaging substrate 302, and a number of components can be mounted on such a packaging substrate. For example, an FE-PMIC component 304, a power amplifier assembly 306, a match component 308, and a duplexer assembly 310 can be mounted and/or implemented on and/or within the packaging substrate 302. The power amplifier assembly 306 may include a cascode system 307 such as that shown in FIG. 5. Other components such as a number of SMT devices 314 and an antenna switch module (ASM) 312 can also be mounted on the packaging substrate 302. Although all of the various components are depicted as being laid out on the packaging substrate 302, it will be understood that some component(s) can be implemented over other component(s).

In some implementations, a device and/or a circuit having one or more features described herein can be included in an RF device such as a wireless device. Such a device and/or a circuit can be implemented directly in the wireless device, in a modular form as described herein, or in some combination thereof. In some embodiments, such a wireless device can include, for example, a cellular phone, a smart-phone, a hand-held wireless device with or without phone functionality, a wireless tablet, etc.

Figure 10:
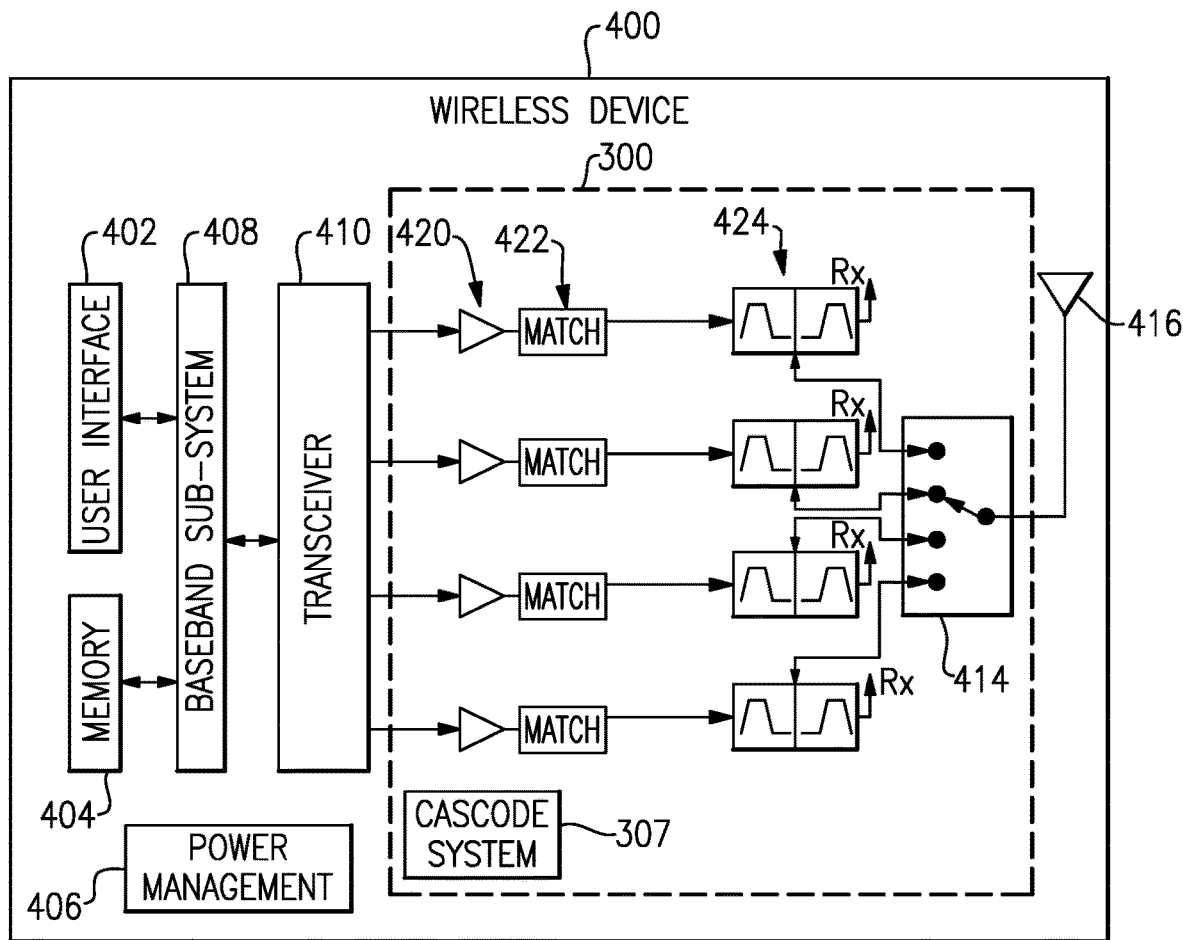
FIG. 10 depicts a wireless device having one or more features described herein.

FIG. 10 depicts an example wireless device 400 having one or more advantageous features described herein. In the context of a module having one or more features as described herein, such a module can be generally depicted by a dashed box 300, and can be implemented as, for example, a front-end module (FEM).

Referring to FIG. 10, power amplifiers (PAs) 420 can receive their respective RF signals from a transceiver 410 that can be configured and operated in known manners to generate RF signals to be amplified and transmitted, and to process received signals. The transceiver 410 is shown to interact with a baseband sub-system 408 that is configured to provide conversion between data and/or voice signals suitable for a user and RF signals suitable for the transceiver 410. The transceiver 410 can also be in communication with a power management component 406 that is configured to manage power for the operation of the wireless device 400.

Such power management can also control operations of the baseband sub-system 408 and the module 300.

The baseband sub-system 408 is shown to be connected to a user interface 402 to facilitate various input and output of voice and/or data provided to and received from the user. The baseband sub-system 408 can also be connected to a memory 404 that is configured to store data and/or instructions to facilitate the operation of the wireless device, and/or to provide storage of information for the user.

In the example wireless device 400, outputs of the PAs 420 are shown to be matched (via respective match circuits 422) and routed to their respective duplexers 424. Each of the power amplifiers 420 may correspond to the power amplifier of FIG. 5 and/or being included in a cascode system 307 such as that shown in FIG. 5. Such amplified and filtered signals can be routed to an antenna 416 through an antenna switch 414 for transmission. In some embodiments, the duplexers 420 can allow transmit and receive operations to be performed simultaneously using a common antenna (e.g., 416). In FIG. 10, received signals are shown to be routed to "Rx" paths (not shown) that can include, for example, a low-noise amplifier (LNA).

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

As described herein, one or more features of the present disclosure can provide a number of advantages when implemented in systems such as those involving the wireless device of FIG. 10. For example, the features may offer the advantage of improved and/or optimized efficiency performance over the entire power and temperature operating range of a power amplifier. Additionally, the bias of the cascode amplifier impacts the AMAM (amplitude-modulation to amplitude-modulation) characteristic of the common emitter stage. As another example, adjustment of the cascode biasing signal can provide improvement in linearity for the power amplifier.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A method of implementing a power amplification system, the method comprising:
    providing a cascode amplifier coupled to an input and an output; and
    providing a biasing component including one or more sensors for detecting at least one of a temperature or a power condition of the power amplification system, the biasing component configured to apply one or more biasing signals to the cascode amplifier, the biasing component including a bias controller and one or more bias components, each respective bias component coupled to a respective bias transistor.

2. The method of claim 1 wherein the biasing component is configured to apply a first biasing signal to a first transistor of the cascode amplifier using a first bias component and the biasing component is further configured to apply a second biasing signal to a second transistor of the cascode amplifier using a second bias component.

3. The method of claim 2 wherein the first biasing signal has a fixed value and is applied to a base of the first transistor of the cascode amplifier.

4. The method of claim 2 wherein the second bias component is a buffer amplifier.

5. The method of claim 2 wherein the second biasing signal is adjustable and is applied to a base of the second transistor of the cascode amplifier.

6. The method of claim 5 wherein the bias controller is configured to provide a reference voltage to the second bias component coupled to a bias transistor.

7. The method of claim 6 wherein the second bias component is configured to provide the adjustable second biasing signal to the base of the second transistor of the cascode amplifier based on the reference voltage.

8. The method of claim 5 wherein the second biasing signal is adjustable based on one or more of a detected temperature or power condition.

9. The method of claim 8 wherein the second biasing signal is an adjustable biasing voltage.

10. The method of claim 9 wherein the biasing component is configured to generate a higher adjustable biasing voltage in response to detecting a higher output power and a lower adjustable biasing voltage in response to detecting a lower output power.

11. The method of claim 9 wherein the biasing component is configured to generate a higher adjustable biasing voltage in response to detecting a lower temperature and a lower adjustable biasing voltage in response to detecting a higher temperature.

12. The method of claim 8 wherein the biasing component includes a digital circuit that stores a table of biasing voltage values in respective association with one or more of a plurality of temperature values or a plurality of power conditions.

13. The method of claim 5 wherein the biasing component includes an analog circuit that provides the adjustable biasing signal.

14. The method of claim 1 wherein the biasing component further includes a power sensor.

15. The method of claim 1 wherein the biasing component further includes a temperature sensor.

16. The method of claim 15 wherein the temperature sensor is a thermistor.

17. A method of implementing a module, the method comprising:
providing a packaging substrate configured to receive a plurality of components; and
providing a power amplification system implemented on the packaging substrate, the power amplification system including a cascode amplifier coupled to an input and an output and a biasing component including one or more sensors for detecting at least one of a temperature or a power condition of the power amplification system, the biasing component configured to apply one or more biasing signals to the cascode amplifier, the biasing component including a bias controller and one or more bias components, each respective bias component coupled to a respective bias transistor.

18. The method of claim 17 wherein the module is a front-end module.

19. The method of claim 17 wherein the biasing component is configured to apply a first biasing signal to a first transistor of the cascode amplifier using a first bias component and the biasing component is further configured to apply a second biasing signal to a second transistor of the cascode amplifier using a second bias component.

20. A method of implementing a wireless device, the method comprising:
providing a transceiver configured to generate a signal;
providing a front-end module in communication with the transceiver, the front-end module including a packaging substrate configured to receive a plurality of components, the front-end module further including a power amplification system implemented on the packaging substrate, the power amplification system including a cascode amplifier coupled to an input and an output and a biasing component including one or more sensors for detecting at least one of a temperature or a power condition of the power amplification system, the biasing component configured to apply one or more biasing signals to the cascode amplifier, the biasing component including a bias controller and one or more bias components, each respective bias component coupled to a respective bias transistor; and
providing an antenna in communication with the front-end module, the antenna configured to transmit an amplified version of the signal received from the output.

\* \* \* \* \*